United States Patent [19]

Hollars et al.

[11] Patent Number: 5,753,092

[45] Date of Patent: May 19, 1998

[54] CYLINDRICAL CARRIAGE SPUTTERING SYSTEM

[75] Inventors: Dennis R. Hollars, Los Gatos; Robert B. Zubeck, Los Altos, both of Calif.

[73] Assignee: Velocidata, Inc., Santa Clara, Calif.

[21] Appl. No.: 703,011

[22] Filed: Aug. 26, 1996

[51] Int. Cl.$^6$ .................................................. C23C 14/34
[52] U.S. Cl. .................. 204/298.26; 204/298.28; 204/298.25; 204/298.19; 204/298.09; 156/345; 118/719
[58] Field of Search ........................ 204/298.26, 298.28, 204/298.25, 298.09, 298.21, 298.03, 298.36; 156/345; 118/718, 719, 729

[56] References Cited

U.S. PATENT DOCUMENTS

| 3,294,670 | 12/1966 | Charschan et al. | 204/298 |
|---|---|---|---|
| 4,051,010 | 9/1977 | Roth et al. | 204/298.26 X |
| 4,500,407 | 2/1985 | Boys et al. | 204/298 |
| 4,734,158 | 3/1988 | Gillis | 204/298.36 X |
| 4,749,465 | 6/1988 | Flint et al. | 204/298 |
| 4,756,794 | 7/1988 | Yoder | 204/298.36 X |
| 4,798,663 | 1/1989 | Herklotz et al. | 204/298.26 X |
| 4,818,358 | 4/1989 | Hubert et al. | 204/298 |
| 4,851,095 | 7/1989 | Scobey et al. | 204/298.26 X |
| 4,860,139 | 8/1989 | Hamilton | 360/126 |
| 4,894,132 | 1/1990 | Tanaka | 204/298.03 X |
| 4,894,133 | 1/1990 | Hedgcoth | 204/192.15 |
| 4,909,314 | 3/1990 | Lamont, Jr. | 165/80.3 |
| 5,163,218 | 11/1992 | Hamilton | 29/603 |
| 5,209,830 | 5/1993 | Martena | 204/298.03 |
| 5,252,194 | 10/1993 | Demaray et al. | 204/298.2 |
| 5,262,028 | 11/1993 | Manley | 204/192.12 |
| 5,287,914 | 2/1994 | Hughes | 165/80.1 |
| 5,425,611 | 6/1995 | Hughes et al. | 414/217 |
| 5,466,296 | 11/1995 | Misiano et al. | 204/298.26 X |

FOREIGN PATENT DOCUMENTS

| 0192865 | 8/1988 | Japan | 204/298.26 |
|---|---|---|---|
| 6-057412 | 3/1994 | Japan | 204/298.26 |
| WO 92/17621 | 10/1992 | WIPO | C23C 14/34 |

OTHER PUBLICATIONS

"Intevac's New MDP–250 Produces High Quality Small Disks"; Intevac Vacuum Systems Division (Sep. 1991).

Data Storage (Feb. 1996), p. 48 beginning "SCSI IDS connector sports three prongs".

Leybold Ag, 2–page brochure entitled "Circulus M65 Single Disk coater for the Production of 65 mm Rigid Disks", undated.

Leybold Ag, 1 sheet entitled "Circulus PC 130", undated.

Primary Examiner—Nam Nguyen
Attorney, Agent, or Firm—Claude A.S. Hamrick

[57] ABSTRACT

A sputtering system comprising three concentric cylinders. The inner and outer cylinders, along with top and bottom sealing flanges, form an annular chamber with cylindrical walls. A central cylinder, disposed between the inner and outer cylinders, includes substrate-carrying openings and serves as a cylindrical carriage which substantially fills the annular chamber passageway and is rotatable in predetermined steps relative to the chamber. Substrate processing devices for deposition, etching, heating, and cooling arc attached around the circumference of the inner and/or outer cylinders. Vacuum pumps are located between substrate processing devices. The openings in the cylindrical carriage are each fitted with a substrate holder for supporting a multiplicity of substrates. Entrance and exit vacuum loadlocks are provided for transferring substrates into and out of the system. The system is designed for substrate processing temperatures of 1000° C. and above.

22 Claims, 12 Drawing Sheets

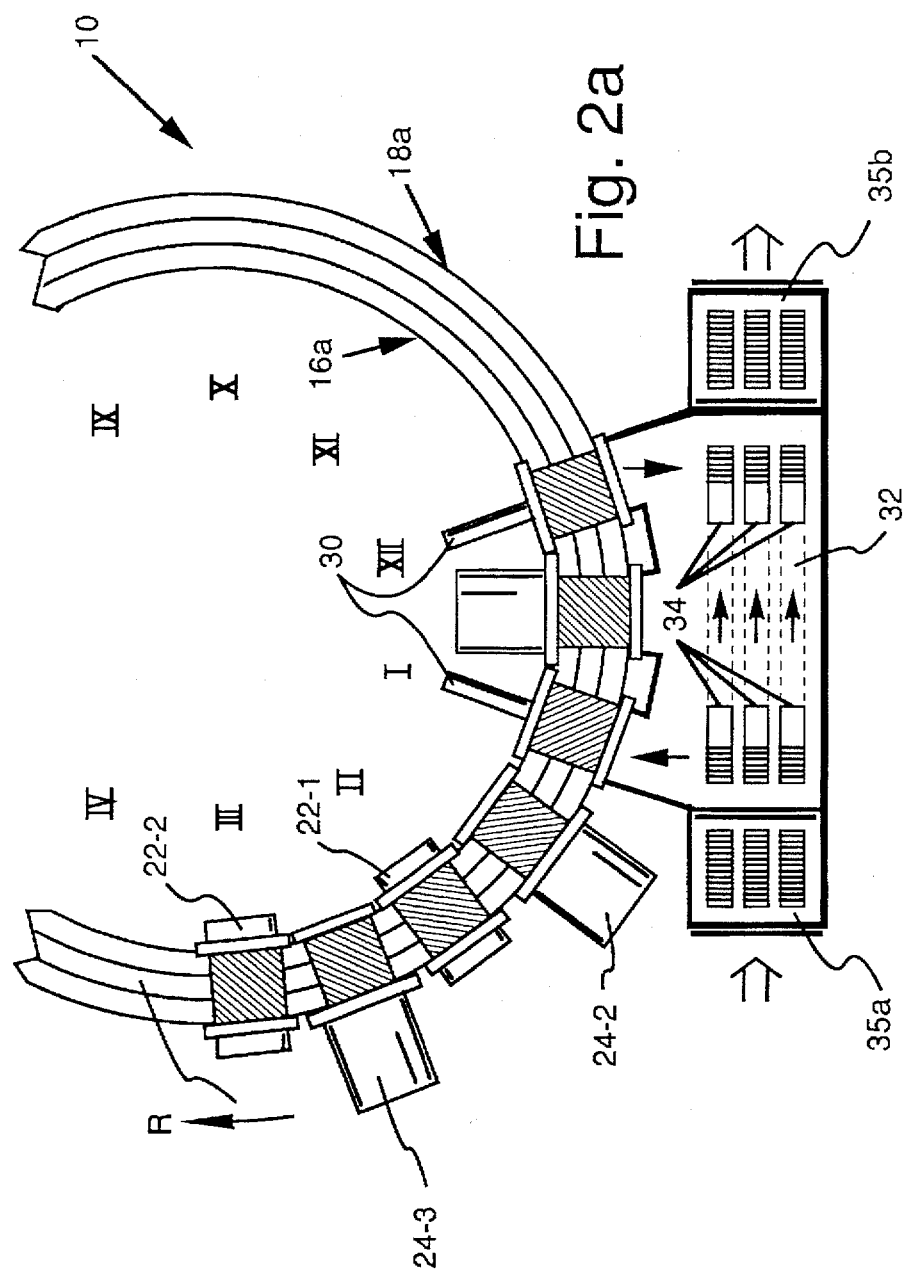

CYLINDRICAL CARRIAGE SPUTTERING SYSTEM

BACKGROUND OF THE INVENTION

1. Field of the Invention

This invention relates generally to substrate handling and coating systems, and more particularly to a novel step and dwell design for the construction of a sputtering machine apparatus for coating computer memory media, semiconductor wafers and other sputter-coatable objects, and including a cylindrical carriage apparatus for the holding, transporting, heating, and coating of a multiplicity of substrates.

2. Brief Description of the Prior Art

Hard disk drives provide fast, non-volatile, rewritable and economical computer memory. Virtually all disk media, such as magnetic hard disks, magneto-optical disks and phase-change optical disks, involve coatings by various physical and/or chemical deposition techniques such as sputtering. Currently, the computer memory disk media industry utilizes two general types of sputtering machines for the sputter-deposition of a succession of various layers onto the disk surfaces to produce the memory media.

The first type of sputtering machine is an in-line or "pass-through" machine. It consists of either a linear arrangement of relatively small individual but connected chambers, or one or two long chambers with vacuum transition locks at each end of the line. Processing stations are located either along the long chambers or at each individual chamber. During deposition, a multiple-disk substrate carrier, called a pallet, continuously passes in front of the sputtering targets or sources. U.S. Pat. No. 4,894,133, issued to Hedgcoth and entitled "Method and Apparatus for Making Magnetic Recording Disk," describes such an in-line machine. Another example is taught by U.S. Pat. No. 4,749,465, issued to Flint et al. and entitled "In-Line Disk Sputtering System." This machine uses a massive block with a semi-circular groove rather than the conventional pallet to hold the disks. Still another example of this type of machine is taught by U.S. Pat. No. 3,290,670, issued to Charschan et al. and entitled "Apparatus for Processing Materials in a Controlled Atmosphere." Vendors of large machines of this type include Ulvac of Japan, Leybold of Germany, and Wilder Associates (formally Circuit Processing Apparatus) of the USA. In addition, some companies custom-build their own large in-line machines for in-house use.

A second type of sputtering machine is a stationary or "static deposition" machine. In these machines, a single disk substrate moves in succession from one processing station to the next, where various processing steps, such as heating, sputtering and cooling, take place while the substrate remains fixed with respect to the processing source (hence the terminology "static machine"). Typically, the processing stations in static systems are arranged along a circular path so that the disk input (loading) and output (unloading) stations are adjacent to each other. Such is the layout of the machine taught in U.S. Pat. No. 5,425,611, issued to Hughes et al. and entitled "Substrate Handling and Processing System." The Intevac MDP-250 memory disk sputtering system made by Intevac is another example of a static system. Of similar layout is another commercial machine, the Circulus 12 built by Balzers/Leybold. Yet another example of a static machine adopting a folded linear design is described in U.S. Pat. No. 4,500,407, issued to Boys and entitled "Disk or Wafer Handling and Coating System." This machine also has the input and output stations adjacent to each other. An exception is the in-line static machine offered by Ulvac, where a pallet carrying several disks stops in front of a group of individual sputtering targets (or sources) each facing a disk in the pallet.

None of the above-described sputtering machines fully satisfies all the requirements for the mass production of high-quality hard disks or wafers. The first-mentioned type of machines have relatively high throughput but usually produce excessive debris and defects in the coated disks. Such contamination debris arise from several sources. One source is attributable to the entrance vacuum lock, where rapid pumping of the load-lock stirs the air violently, causing transfer of small particles of debris from the pallet and the chamber interior to the surface of the disks. The debris particles are generally knocked off the disks by after-coating buffing and/or burnishing, leaving defects in the magnetic memory layer and other layers.

A second source of particulate debris in pass-through machines is the vibrational motion of the disks in the pallet as the pallet moves through the machine. Since the pallet makes many passes through the machine before cleaning, a relatively thick layer of coating gradually builds up on the pallet. The stress in the films builds up with thickness. The combined film stress, thermal cycling and abrasive action between the disk edge and the pallet holder lead to shedding of particulate debris. Some shedding of debris at the disk holder may also occur upon loading the disk onto the pallet; such shedding may occur even if sophisticated robots are used. The pallet-related debris also lead to defects in the layers including the magnetic memory layer.

Arcing or spitting in the carbon overcoat deposition station presents another source of magnetic defects. Most of today's hard disks use hydrogenated carbon (also called diamond-like carbon or DLC) as the overcoat or protective layer. Unlike electrically conductive graphite, hydrogenated carbon is a dielectric. It builds up an insulating layer on various areas of the sputtering target, causing sporadic arcing. The arc-accelerated particulates can penetrate the magnetic memory layer and produce memory defects. Although this problem may be alleviated by reducing the power supplied to the sputtering target, this also decreases the carbon sputtering rate and accordingly reduces the machine throughput. A better solution to the arcing problem appears to be the use of a different, e.g., silicon carbide (SiC), overcoat in lieu of the conventional hydrogenated carbon overcoat. However, the SiC sputter-deposition is normally conducted at an elevated temperature, i.e., 700° C. or above. Most of the current machines of the first-mentioned type use aluminum pallets that tend to warp, soften or even melt at elevated temperatures. Other pallet materials with higher melting points could be used, but the cost would be prohibitively high.

A static machine carries a single disk at a time sequentially from one processing station to the next. Because no pallet is used, the shedding of debris is greatly reduced, and the process temperature can be higher than that in a typical pass-through machine. As a result, such machines generally produce disks with fewer magnetic defects and debris contamination compared with a pass-through machine. However, these machines have their own drawbacks. First, the one-disk-at-a-time processing in a typical static machine causes its throughput to be two to four times lower than that of a typical pass-through machine. In addition, unless a pass-through machine can be made totally compatible with high-temperature processing, as described in detail below, the problem of arcing during carbon deposition will persist, making it practically impossible to raise the throughput of the machine by simply raising the power to the sputtering target. Finally, because the equipment costs of the two types of machines are similar, the per-disk manufacturing cost for a static machine is generally noticeably higher than that for a pass-through machine. In short, because future magnetic hard disk drives, with higher packing densities, will command low-cost disks with extremely low defects, there is an urgent need to raise the throughput of a static machine to the level of a pass-through machine without sacrificing quality or cost.

Current magnetic disk sputtering machines have several additional limitations. One of the most severe limitations is that they generally are not compatible with high-temperature processing dictated by newly developed, advanced substrate and coating materials. Currently, most magnetic hard disk substrates comprise non-magnetic nickel phosphorus plated aluminum (NiP/Al). This substrate cannot be heated above approximately 300° C., due to phase segregation in the NiP, which renders it magnetic and, therefore, useless. Also, the NiP/Al substrates begin to warp and deform long before the aluminum melting point of 660° C. is reached. Development work has been done on alternative substrate materials, e.g., silicon carbide, glass and ceramics, and on alternative overcoat materials, e.g., silicon carbide. Future disk coating machines must be compatible with these new materials.

A first issue in connection with this high-temperature compatibility problem is that heating devices in current magnetic disk sputtering machines are often not designed for rapid high-temperature processing. To maintain the throughput of the machine, it is desirable to have new heating devices that will rapidly heat up disks to the processing temperatures and, in particular, to the high processing temperatures (e.g., 1000° C.) dictated by the aforesaid advanced substrate and coating materials in approximately the same length of time as for heating NiP/Al substrates in current machines. Additionally, it is desirable that the new heating device has improved substrate thermal isolation so that most of the thermal energy will go to the substrate but not its surroundings.

A second issue in connection with the aforementioned compatibility problem is that cooling methods and devices in current magnetic disk sputtering machines are often not designed for rapid cooling, either. The hydrogen content in the hydrogenated carbon film decreases as the substrate temperature increases. To possess certain desirable tribological properties, the hydrogenated carbon film preferably contains a certain amount of hydrogen. Hence, to ensure proper hydrogen content in the sputtered carbon film, substrates must be cooled in special cooling stations prior to the carbon deposition. This additional step will slow down the process unless it is efficient. Various prior art methods have been used for cooling substrates in evacuated chambers. One example is U.S. Pat. No. 4,909,314, issued to Lamont, Jr. and entitled "Apparatus for Thermal Treatment of a Wafer in an Evacuated Environment," which teaches a near-contact heat exchanging body configured in the shape of the article to be cooled. The surface of the article and the heat exchanging surface are not in intimate thermal contact. Rather, a conductive gas at a pressure significantly higher than that in the vacuum chamber but significantly lower than the atmospheric pressure is introduced between the two surfaces to fill the voids and improve the heat exchange between them. Another example is U.S. Pat. No. 5,287,914, issued to Hughes and entitled "System for Substrate Cooling in an Evacuated Environment," which teaches a stationary cooling system for thin substrates. This system employs a space or gap between the heat exchanger and the substrate. A highly conductive gas (e.g., helium) at a pressure of a few torr is introduced into the space to cool the substrate surface through both conduction and convection. However, even a highly heat-conductive gas is not a good heat conductor in comparison to most solids. Convective gaseous heat transport at such relative low pressures is not very effective, either. As a result, neither of these devices provides sufficient cooling for substrates. As a specific example, in the Hughes method above, the cooling rates across the 0.05 to 0.25 inch gap are only about 150° C. per minute under ideal conditions. In a high-throughput disk coating machine, substrates are typically transported to the next processing station every 10 seconds or less. This means that substrates can only be cooled by about 25° C. at a single cooling station. Furthermore, many new substrates, e.g., silicon carbide, are processed at temperatures above 700° C. Therefore, to maintain the throughput of the machine, it is desirable to have new cooling devices that will cool down the disks more rapidly, particularly if high-temperature processing is involved.

Another limitation of typical current magnetic disk sputtering machines is that their process monitoring and control methods and setups are often either ineffective or overly complicated. To allow rapid detection and correction of problems associated with each of the processes, so that the overall product yield can be improved, there is a need for a simple yet effective process monitoring and control system that can be built into essentially all of the processing stations of a coating machine.

Yet another limitation of typical current magnetic disk sputtering machines is that their substrate holders do not meet the requirements of a high-quality, high-throughput coating machine. Typically, a disk in a static machine seats in the holder by gravity. To allow for rapid acceleration and deceleration associated with faster disk transport from one processing station to the next, disks need to be supported more solidly in the machine without merely relying upon gravity to seat them into the holders. In addition, the holder and shields must work together to confine the coating flux to the substrate and minimize coating of the holder, so that flaking of particulate debris from the holder can be reduced. An improved substrate holder should also be operable at elevated temperatures, e.g., 1000° C., to permit processing of advanced substrate and coating materials described above.

A further limitation of typical current magnetic disk sputtering machines is that their sputtering magnetrons are often not optimally designed, particularly if multiple substrates are handled simultaneously. Planar sputtering magnetrons using permanent magnets have been used in the prior art, mostly for coating from a variety of electrically conductive targets. For example, U.S. Pat. No. 5,262,028, issued to Manley and entitled "Planar Magnetron Sputtering Magnet Assembly," teaches both circular and rectangular planar magnetrons, whose improved magnetic pole-piece structures allow better utilization of the target material. Another example is U.S. Pat. No. 4,818,358, issued to Hubert et al. and entitled "Magnetron Cathode Sputter Coating Apparatus," teaches the use of an arrangement of oriented magnets to form two curved racetracks on a rectangular planar magnetron. However, both the above magnetrons are designed for processing one substrate at a time. It is, therefore, desirable to have a new planar magnetron, powered by a single power supply, which allows the simultaneous processing of a multiplicity of disk or wafer substrates at a given processing station.

All of the patents mentioned above are hereby incorporated by reference for purposes of additional disclosure.

SUMMARY OF THE INVENTION

Accordingly, it is an object of the present invention to provide a high-throughput substrate coating machine without sacrificing quality and cost achievable with the prior-art coating machines.

Another object of the present invention is to provide a memory disk or wafer substrate sputtering machine compatible with processing at elevated temperatures (e.g., 1000° C. and above) dictated by advanced substrate and coating materials.

Yet another object of the present invention is to provide a process monitoring and control system that can be used for effective and reliable process monitoring and control purposes.

Still another object of the present invention is to provide an improved substrate holder suitable for a high-throughput, high-disk or wafer quality coating machine, particularly when elevated processing temperatures are involved.

Yet another object of the present invention is to provide a heating device that has improved substrate thermal isolation and can rapidly heat up substrates to the desired processing temperatures.

Another object of the present invention is to provide a cooling device that can cool down substrates rapidly from the processing temperatures, particularly when elevated processing temperatures are involved.

A further object of the present invention is to provide a magnetron design suitable for coating machines, particularly if sputter-deposition of multiple disks or wafers is involved.

According to one aspect of the present invention, the coating machine comprises essentially three concentric hollow cylinders. The inner and the outer hollow cylinders have a plurality of cutouts to accommodate a plurality of stations including an input station, an output station, a plurality of processing stations, and a plurality of pumping stations. The central hollow cylinder, i.e., the cylindrical carriage, has cutouts, each of which is adapted to carry one or more substrates. The central hollow cylinder rotates, in incremental steps, relative to the two outer cylinders, causing the substrates to be transported and processed from one station to the next without the use of pallets. Tight tolerance clearances between the outer cylinder walls and the central cylinder ensures vacuum isolation between the stations without the need for internal doors, conventional vacuum seals or valves separating chambers. The machine design and choice of materials used in its construction permit the processing of substrates at elevated temperatures (e.g., above 1000° C.). In one particular embodiment of the invention, the input and output stations are adjacent to each other, allowing the use of a single vacuum chamber for both loading and unloading of substrates.

According to another aspect of the present invention, a new simple and reliable process monitoring and control system can be used with the coating machine. Essentially, passageways are formed within either or both of the inner and the outer cylinders near any of the processing stations. Such a passageway houses optical means for guiding light from the interior of the station to a set of appropriately chosen optical filters. Light signals passing through these filters are then processed and their intensity ratios or "color differences" are used for the purposes of monitoring and control of the process.

In accordance with yet another aspect of the present invention, new substrate holding devices each accommodating one or more substrates can be used with the above coating machine. Essentially, each new holding device comprises a plurality of panels mounted on the substrate-carrying part of the machine, e.g., the cylindrical carriage described above. The panels are held together by, e.g., springs, so that they can be mechanically spread apart for the loading and unloading of the substrates. Each substrate is held in place by "fingers" each with a notched or forked end that holds the edge of the substrate. In a preferred embodiment, the fingers are electrically conducting whereas the panels are electrically insulated from the machine, so that a substrate bias voltage can be applied during sputtering.

According to still another aspect of the present invention, new heating devices can be used at processing stations of the coating machine. Essentially each heating device comprises a heating means for providing thermal energy, shielding means for directing thermal energy toward the substrates, and a means for retracting the heating device from or moving it into its operating position. In a preferred embodiment, the shielding means are separately cooled to remove thermal energy transferred thereto.

Yet another aspect of the present invention provides new cooling devices that are used at processing stations of the coating machine. Essentially, each cooling device comprises one or more pairs of platens that can be moved to close proximity with one or more substrates, heat-absorbing, separately cooled shielding means for removing radiant heat from substrates, a gas source for providing a conductive gas to the surfaces of the substrates, passageways for removing such gas from the processing station, and a means for retracting the cooling device from or moving it into its operating position. The interior of the cooling device is so designed that, when the device is at its operating position, local pressure of the conductive gas around the substrate is significantly higher than what can be achieved in the prior art, thus greatly enhancing conductive and convective heat transfer from the substrate. In a preferred embodiment, the platens are coated with heat-absorbing layers and are separately cooled to enhance heat transfer. In an embodiment particularly suitable for high-temperature processing, the platens are coated with compliant layers and brought into intimate thermal contact with the substrates to further enhance heat transfer.

According to still another aspect of the present invention, several new designs can be used for making magnetrons for the coating machine. Essentially, each of these new magnetrons has two magnetic pole-pieces specifically shaped, e.g., having a folded or double-folded shape, to provide one or more areas of uniform magnetic field and/or "averaged" incidence of coating flux and to allow more uniform consumption of the target material. Several of these magnetrons can effectively work with multiple substrates but still be powered by a single power supply. Depending on the particular type of material to be sputter-deposited, one or more of these new magnetron designs can be used.

An advantage of the present invention is that the new coating machine can generate memory disks and semiconductor wafers having a high degree of cleanliness without sacrificing the throughput of the machine.

Another advantage of the present invention is that the manufacturing cost per substrate is significantly reduced compared to prior-art static machines.

Yet another advantage of the present invention is that it is compatible with high-temperature substrate and coating materials that are becoming industrial standard materials for advanced memory disks.

Still another advantage of the present invention is that it can process multiple memory disks or wafer substrates simultaneously without demanding a large floor-space footprint.

Yet another advantage of the present invention is that its simple yet effective process monitoring and control system provides a reliable and cost-effective means for manufacturing quality control.

Still another advantage of the present invention is that it has improved magnetron sputtering devices that allow more effective and economical use of the target materials.

These and other objects, features and advantages of the present invention will no doubt become apparent to those skilled in the art after having read the following detailed description of the preferred embodiments which are illustrated in the several figures of the drawings.

IN THE DRAWING

FIG. 2a is a view similar to that of FIG. 2 but showing a single input/output vacuum chamber;

DESCRIPTION OF THE PREFERRED EMBODIMENT

While this invention may be embodied in many forms, details of a particular embodiment are schematically shown in FIGS. 1–11, with the understanding that the present disclosure is not intended to limit the invention to the embodiments illustrated.

Figure 1:
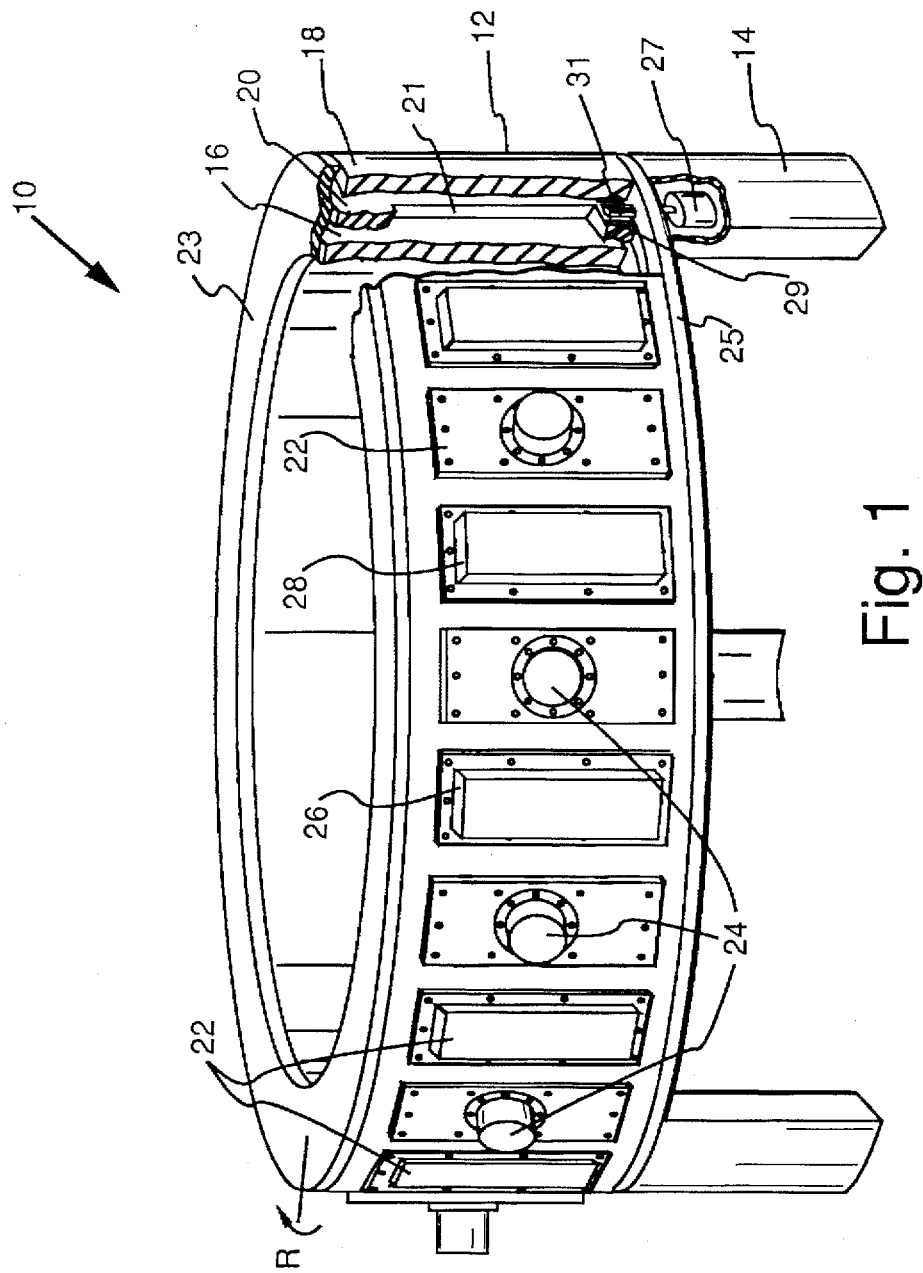
FIG. 1 is a perspective view illustrating several stations of a cylindrical carriage coating machine in accordance with the present invention.

In the embodiment of the present invention illustrated in part in FIG. 1, a cylindrical carriage coating machine 10 comprises a main structure 12 and a supporting structure 14. The main structure 12 may conveniently take the form of a hollow annular ring, and the supporting structure 14 may include three or more legs. Both ring 12 and the supporting structure 14 are depicted schematically in FIG. 1 partially broken to show various internal detail. The main structure 12 comprises an inner cylinder 16, an outer cylinder 18 disposed concentric with cylinder 16, and a centrally disposed concentric cylinder (the "cylindrical carriage") 20 that is rotatable within the space separating cylinders 16 and 18. As will be further described below, cylinder 20 is provided with a plurality of openings 21 for receiving substrates to be processed. Cylinder 20 thus serves as a carriage for transporting the substrates. As further illustrated in FIG. 1, the cylinders 16 and 18 are joined together by annular top and bottom plates 23 and 25, respectively, to form a hermetically sealed chamber within which the cylinder 20 is enclosed. The construction materials and the wall thicknesses of the cylinders 16 and 18 are so chosen that they provide adequate strength to withstand vacuum forces to be applied within the coating machine. The walls of the three cylinders 16, 18 and 20 may be of approximately the same thickness, or they may be different depending on the specific materials used for construction.

During the operation of the machine, the cylindrical carriage 20, which is carried by suitable bearings (not shown), rotates in incremental steps relative to the inner and outer cylinders 16 and 18, which remain stationary during the operation. The stepped rotation of the cylindrical carriage 20 may be accomplished, for example, by the use of one or more motors 27 coupled to a rack and pinion drive system, in which a relatively large circular rack gear 29 is embedded near the base of the carriage cylinder 20 and is driven by a relatively small pinion gear 31 by the motor 27. For clarity and simplicity, further details of the rotation means, as well as other commonly used ancillary equipment such as vacuum pumps, power supplies, substrate load/unload mechanisms, and computers for data processing and control, are not shown in FIG. 1.

A plurality of processing stations 22 and pumping stations 24 are conveniently spaced around the inner cylinder 16 or the outer cylinder 18, or both. Processing stations 22 may be configured as, for example, heating stations, sputter-deposition stations including targets and magnetrons, etching (e.g., ion-gun etching or reactive-ion etching) stations, cooling stations, dwell and outgassing stations or chemical-vapor-deposition stations. Pumping stations 24 preferably carry turbomolecular pumps, even though other types of pumps such as cryogenic pumps may also be used. Also shown in FIG. 1 is a substrate input (or vacuum load-lock) station 26 and a substrate output (or vacuum exit-lock) station 28. In the particular embodiment depicted in FIG. 1, the carriage cylinder 20 rotates clockwise between the inner and outer hollow cylinders 16 and 18, even though the input station 26, processing stations 22, pumping stations 24 and output station 28 may be conveniently arranged such that the cylindrical carriage 20 rotates counterclockwise between the inner and outer cylinders 16 and 18.

For simplicity and clarity, FIG. 1 shows only a few processing stations 22 and pumping stations 24. In a typical coating machine, these stations are equally spaced around the inner and/or outer circumferences of the structure 12. The number of stations that may be accommodated on a particular machine depends upon the inside and outside diameters of the structure 12 and the sizes of the stations. The latter, in turn, depend upon the sizes of the substrates to be processed. Typically, the outside diameter of structure 12 for the processing of disks of 95 mm diameter is 6 to 9 feet. Such a structure can accommodate 9 to 15 processing stations, plus input and output stations and an appropriate number of pumping stations. If substrates of a different size are processed, a larger main structure 12 having a larger diameter can be used to accommodate any desired number of processing and pumping stations.

Figure 2:
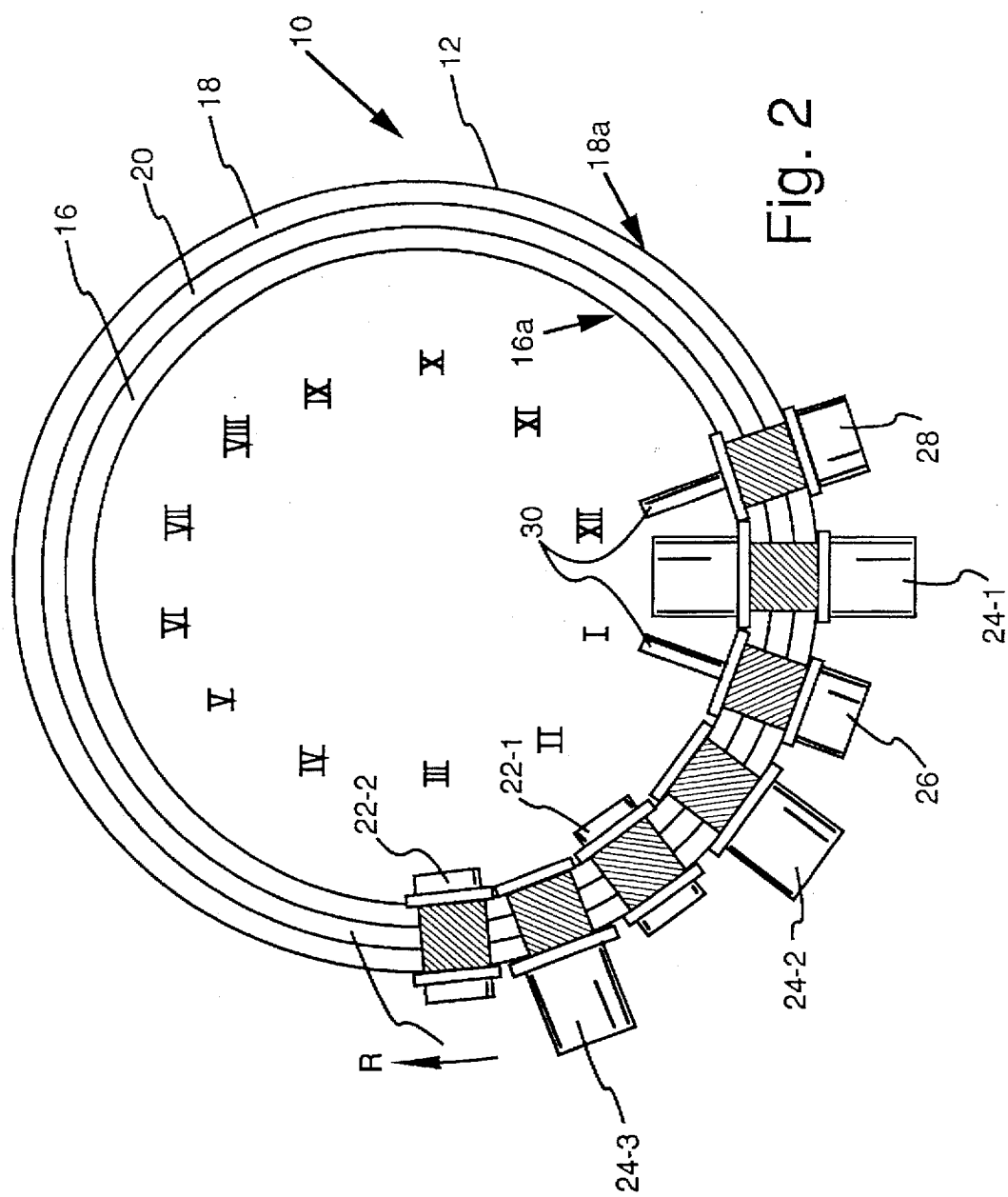
FIG. 2 is a schematic cross-sectional view taken horizontally through the main structure and several stations of the coating machine of FIG. 1.

To further illustrate the coating machine of FIG. 1, FIG. 2 shows a horizontal, cross-sectional view of the above-described embodiment. Again, the main structure 12 comprises three concentric cylinders 16, 18 and 20. As mentioned above, depending on the outside diameter of the main structure and the sizes of the stations, a number of stations can be accommodated on the inner cylinder 16 as well as the outer cylinder 18. For simplicity and clarity, only the input station 26, output station 28 and some of the processing and pumping stations are shown in FIG. 2. For example, the pumping station 24-1 separates the input station 26 and the output station 28, the pumping station 24-2 is disposed between the input station 26 and the first processing station 22-1, the pumping station 24-3 separates the first processing station 22-1 and the second processing station 22-2, and so on. In a typical coating process for making magnetic hard disks, the first processing station 22-1 may be configured as a heating station, while the second processing station 22-2 and several subsequent processing stations may be used for the sputter-deposition of various layers on substrates. At pre-determined incremental steps during the operation of the coating machine 10, the cylindrical carriage 20 rapidly rotates through an angle equal to the distance between adjacent stations and advances the set of substrates to their next station. Optical or other types of position sensors provide signals for accurate placement of the cylinder carriage 20 at each of the stations. Both the input station 26 and the output station 28 use loading/unloading means 30, e.g., robotic mechanisms (not shown), for loading substrates into and unloading substrates from the coating machine 10.

In an alternative embodiment of the invention depicted in FIG. 2a, the input station 26 and the output station 28 may be combined into a single input/output vacuum chamber 32 which may conveniently hold several cassettes 34 of disks as well as provide access by the loading/unloading means 30. The enlarged input/output vacuum chamber 32 may also include vacuum load-locks 35a and 35b for transfer of full cassettes 34 into and out of the vacuum chamber 32. This configuration has the benefit of avoiding the necessity of rapidly pumping individual load-locks every time a cassette of disks is loaded or unloaded. Additionally, this configuration allows an entire set of cassettes to transfer from one station to the next on a single pump-down of the vacuum chamber 32. The loading/unloading means 30, e.g., a robotic arm with extensions (not shown) to reach cassettes 34, holds three disks (one from each of the three cassettes) and swings vertically and translates horizontally to effect the disk loading and unloading from the substrate holder. This pump-down can conveniently be carried out over a prolonged period of time, thus minimizing particulate debris due to the stirring action of the pump-down.

As those skilled in the art would readily realize, the vacuum load-locks may conveniently have mechanical roughing pumps and Roots type blower pumps. These pumps serve to evacuate the locks during coating operations and to evacuate the entire system following vent-ups for maintenance and target changes.

Figure 3:
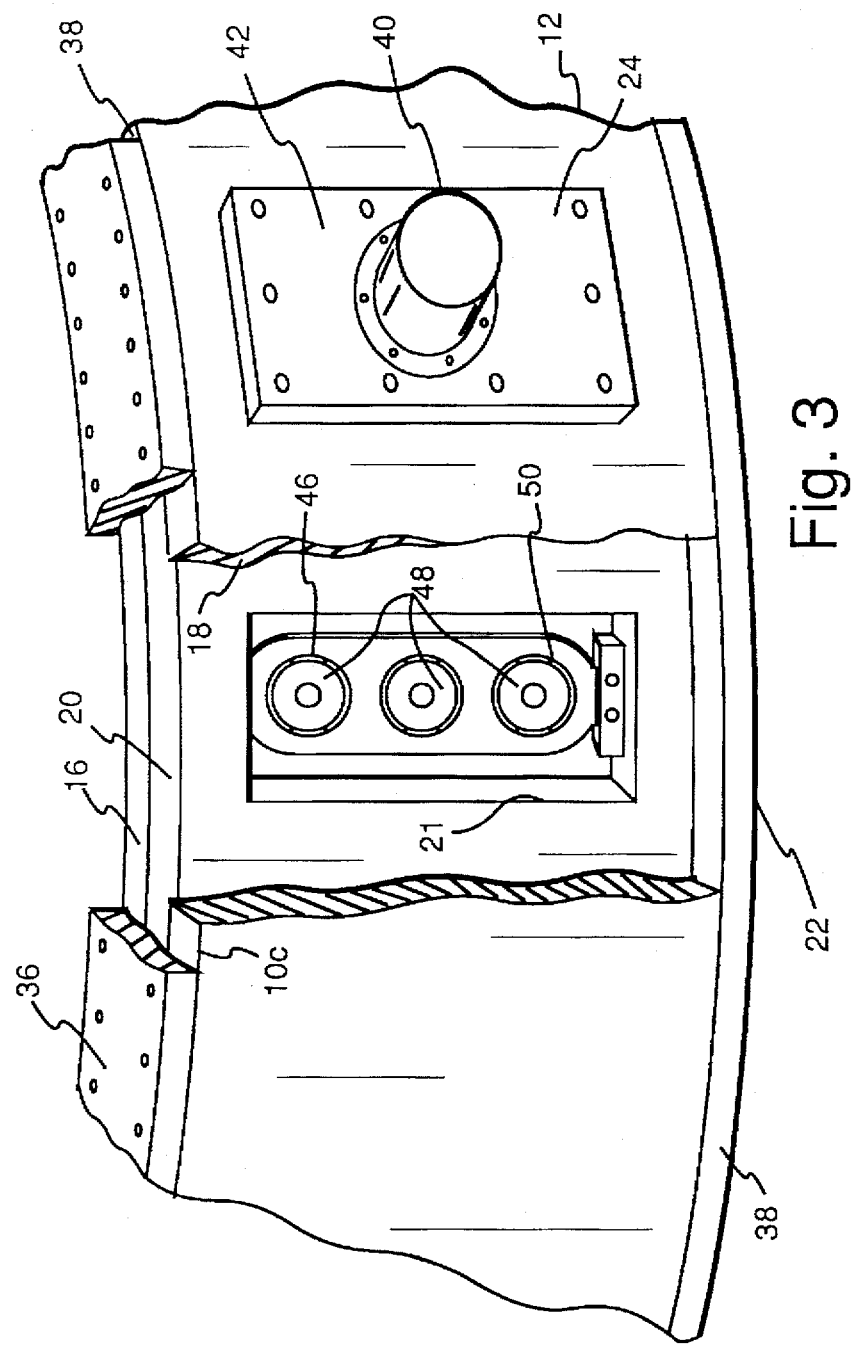
FIG. 3 is a cutaway view of a part of the main structure showing a disk-holding device at a processing station (broken away) and an adjacent pumping station.

FIG. 3 shows other aspects of the design of the main structure 12 of the coating machine. As described above, the cylindrical carriage 20 is made to rotate, at pre-determined steps, between the inner and outer concentric cylinders 16 and 18. The inner and outer cylinders 16 and 18, in combination with the top annular flange 36 and the bottom annular flange 38, form the main vacuum region of the coating machine. To maintain vacuum isolation between adjacent processing stations, the clearances between the surfaces of cylindrical carriage 20 and those of the cylinders 16 and 18 should be kept very small, preferably within a few thousandths of an inch.

A pumping station 24 is depicted in FIG. 3. The pumping station 24 has a turbomolecular pump 40 mounted on a side flange 42. Although turbomolecular pumps are considered the best for this coating machine, other types of pumps such as cryogenic pumps or diffusion pumps may also be used. A similar pumping station, not separately shown for simplicity, may be located on the left side of the processing station 22, shown broken away to reveal a section of the cylindrical carriage 20. As previously indicated in FIG. 1, the carriage 20 has a plurality of openings 21, each of which houses a multiple-substrate-holding device 46. Not shown in FIG. 3 are additional openings, slots or webs in the circular carriage 20 for vacuum channels and mass reduction. In the particular embodiment shown in FIG. 3, the substrate-holding device 46 has positions for three disks or wafers 48 which are supported and held in position by thin fingers 50 which should be electrically conductive and able to withstand elevated temperatures. The fingers provide reasonable thermal insulation between the substrates 48 and the holder 46. Such fingers may, for example, be comprised of flexible tungsten wires or thin tungsten ribbons. In other embodiments, the number of substrate positions in each holding device 46 can be different from three, but should, obviously, be at least one.

Figure 4:
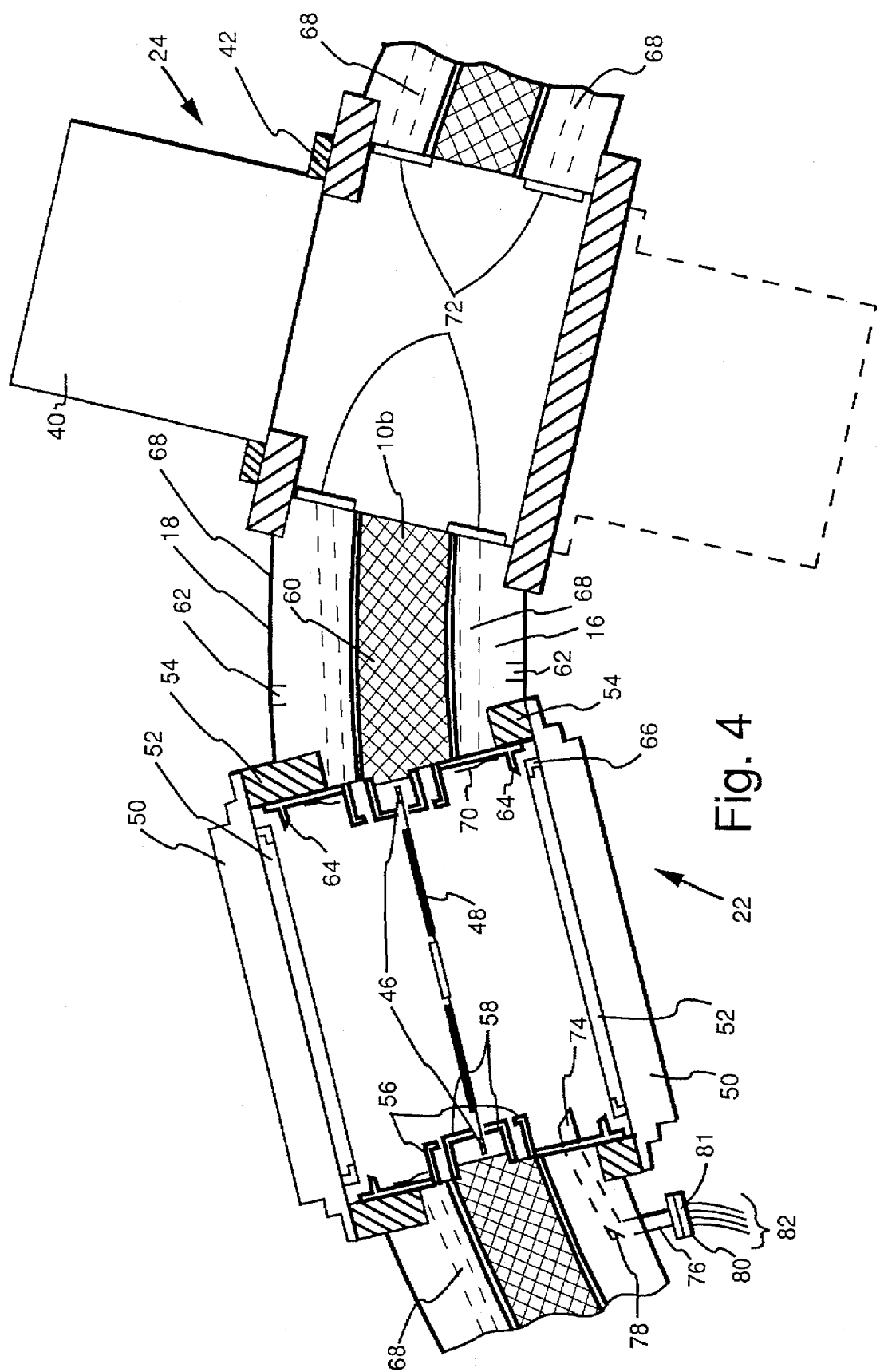
FIG. 4 is a schematic cross-sectional view showing a part of the structure including a processing station configured for sputtering and an adjacent pumping station.

FIG. 4 shows further aspects of the main structure of the coating machine. One turbomolecular pump 40 is shown attached to the outer wall of the outer cylinder 18 via a side flange 42. If desired, an additional pump may be attached to the other, or in-side of the main structure, i.e., the inner wall of the inner cylinder 16. The process station 22 comprises magnetrons 50 placed at the back of sputtering target assemblies 52. During sputter-deposition, substrates 48 (carried by the holder 46) are coated by the target material. Insulating flanges 54 are used to attach the magnetrons 50 and sputtering target assemblies 52 to the inner cylinder 16 and outer cylinder 18 of the main structure 12.

As depicted, shielding means, such as the shields 56 and 58, are used to prevent coating of the substrate-holding device 46. Shields 56 are attached to openings in the inner cylinder 16 and the outer cylinder 18, while shields 58 are attached to the cylindrical carriage 20. So attached, shields 56 may be directly water cooled, while shields 58 may be indirectly cooled through radiation and convection. A high-emissivity coating 60 may be applied to both surfaces of the cylindrical carriage 20 and to the inside surfaces of the inner and outer cylinders 16 and 18 to facilitate heat removal from shields 58. The high-emissivity coating may consist of a low outgassing black paint similar to MH-2200 made by IIT Research Institute in Chicago, Ill. In addition, a series of embedded water cooling channels 62 located within the inner and outer cylinders 16 and 18 serve to remove excess heat from the coating machine.

Shields 56 and 58 should preferably be made of metals with good heat conducting properties. For example, copper is a suitable material for shields 56 because it is an excellent heat conductor and allows easy attachment of water cooling lines. On the other hand, because shields 58 are not directly water cooled, aluminum may provide a cheaper solution than copper, although copper or other metals could also be used. Regardless of the construction material of the shields, their surface should preferably not be smooth. Roughening or dimpling the surface of shields 56 and 58 increases the surface area, thereby improving adhesion of the coating of the sputtered material. In addition, dimpling helps to minimize the stress in the deposited coating which, in turn, keeps such coating from flaking off prematurely.

Appendages 64 on shields 56, located over, but insulated from, mounting clamps 66 of the sputtering target assemblies 52, serve as anodes in the sputtering high voltage circuit. The sputtering gas (e.g., argon) is introduced, in a conventional way, around the magnetrons 50 or under the anodes 64.

Passageways 68 between the processing station 22 and its adjacent pumping station 24 provide controlled flow of the sputtering gas into the pumping station 24. Small tabs 70 in the processing chamber shield the passageways 68 to reduce deposition of the sputtered material into the passageways 68. Adjustable orifice covers 72, located at the pumping-station ends of the passageways, allow versatile regulation of gas flow rates and the processing chamber pressure. Each processing station can thus have its own individual gas, gas flow rate and pressure set independently of the other processing stations.

In accordance with another aspect of the present invention, each processing station 22 may be equipped with an optical sensing system, comprising, e.g., fiber optic relay pick-up cables, and conveniently attached to a central processor or computer, for the monitoring and control of the particular process. Optical signals may be transferred from the vacuum system to fiber optic relay pick-up cables in the following way. A first tube 74 extends through the shield 56 and into the inner cylinder 16. A second tube 76 connects with the first tube 74 at an angle (e.g., 90°), with a mirror or prism 78 placed at the angle formed by the two tubes. Alternatively, a single tube may be bent into the proper shape and replace the two tubes 74 and 76. Preferably, none of these tubes intersect the gas passageway 68. In a coating chamber 22, the ratio between the length and the diameter of tube 74 is preferably large to minimize coating of the mirror 78 during the coating process. A vacuum flange 80 is used to seal an optical window 81 made of, e.g., quartz or sapphire, at the end of the tube 76. A plurality of (e.g., four) fiber optic cables 82 are used to pick up light from the interior of the process station via reflection from the mirror 78. The light then passes to a conventional central optical signal processor, where electric signals are generated for the monitoring and control of the process.

Figure 5:
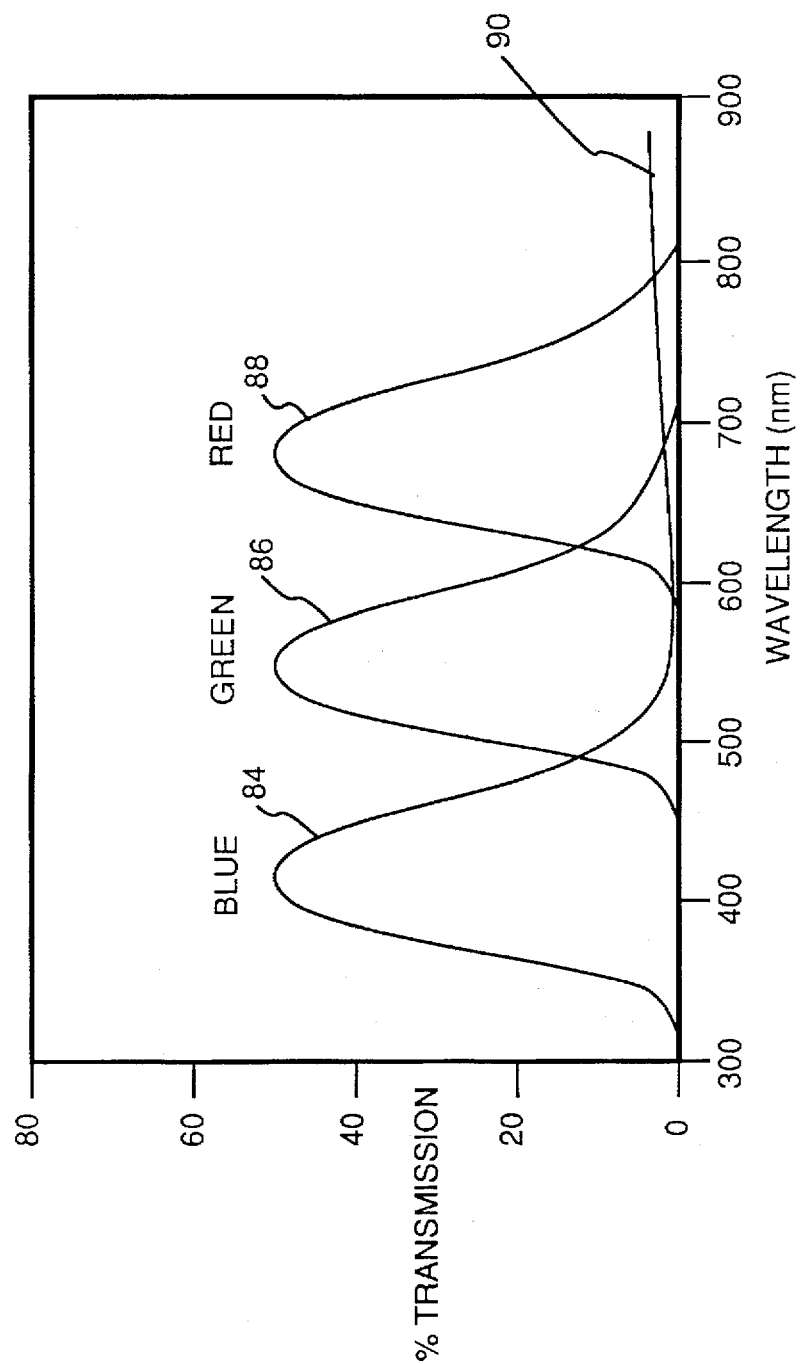
FIG. 5 is a graphic representation of transmission vs wavelength for commercially available colored glass filters.

Several monitoring optical schemes can be devised to employ the light signals transmitted via the fiber optic cables 82. As an example, FIG. 5 shows a schematic graph of the transmission (as percentages) vs. wavelength for a simple and effective arrangement of three, readily available, colored glass filters. Curves 84, 86 and 88 represent transmission responses for blue (B), green (G), and red (R) filters, respectively. Because B filters usually have some degree of red leak, as indicated by curve 90, adequate B filters should have as little red leak as possible. The bandpass of any filter (B, G or R) may be further tuned or shaped by, for example, stacking two or more colored filters with different individual bandpasses to create a desired composite bandpass. The red leak in many violet and blue filters may also be eliminated in this way. Preferably, an ultraviolet (U) filter may be added to the filter set, since plasma light sources have, in general, significant emissions in the ultraviolet region. A system including the U filter may require fused quartz or sapphire vacuum windows and high-quality quartz optical fibers to transmit the ultraviolet light from the sputtering system to the filter. Additionally, the photodiode detector used with the U filter may need ultraviolet enhancement. A system with the U channel is, therefore, more expensive than the basic B-G-R system.

In the particular embodiment depicted in FIG. 4, three of the four fiber optic cables 82 may be used to transmit light through a set of three color filters. The output from the fourth fiber cable can be used without filtering as a "white light" channel. Typical silicon photodiodes having adequate sensitivity for wavelengths between, e.g., 300 nm and 1100 nm may conveniently be used to detect the light intensity from the output of each fiber optic cable.

The intensity ratios obtained by dividing the measured light intensities through the filters (i.e. B/G and G/R) may be related to the conditions of the light source, including, e.g., plasma conditions in a sputtering chamber, the status of quartz lamps in a heating station, or other process station parameters. These color intensity ratios are essentially insensitive to variations in the total light intensity, thus simplifying the mounting and alignment of the various components. Alternatively, the logarithm of the value of the light intensity through the filter, rather than the value of the intensity itself, is measured. In that case, the ratios of the intensities are obtained by taking the difference of the measurements. These are commonly referred to as "color differences" by persons skilled in the art. The non-filtered white light channel has generally much higher signal than the filtered channels and can thus be used to detect fast events such as arc discharges in the sputtering plasma.

Several variations of the aforesaid scheme are possible. For example, the use of additional filters may generate additional color intensity ratios. Similarly, very narrow bandwidth (i.e., interference) filters may allow the monitoring of individual spectral emission lines in the sputtering plasma. Regardless of the details of the particular optical system, the optical outputs may generate, through proper algorithms known in the prior art, real-time information relating to the process conditions in the processing station. Such information provides early warning of a developing problem and its approximate physical location, making it possible to correct such problems. Furthermore, such information can be incorporated and integrated into a highly responsive statistical process control system.

The optical monitoring system described above is capable of detecting several common problems occurring in the machine. Small vacuum leaks and water outgassing often cause degradation of coating properties. The incorporation of oxygen, water, or nitrogen into the growing film may result in severe degradation of the film properties. The color of the sputtering plasma is determined by the superposition of emission lines from the materials being sputtered and the emission lines of the argon sputtering gas. In general, the former are mostly in the blue region of the spectrum, while the latter are in the red region. Once the color ratios are known for a given argon pressure and deposition power setting in a clean system, very small levels of contaminants are detected as small changes in the color ratios. Gaseous contaminants generally shift the color ratios to the red, while metal contaminants (such as those originating from the target backing plate) generally shift the ratios to the blue. Optical monitoring of the substrate heater can detect a burned out lamp through a sudden incremental change in intensity, or determine a degraded condition of the lamp through a shift in the color ratio. Advantages of optical detection include early warning of a developing problem, and its approximate physical location. This real time feedback data can be incorporated and integrated into a highly responsive statistical process control system.

Figure 6:
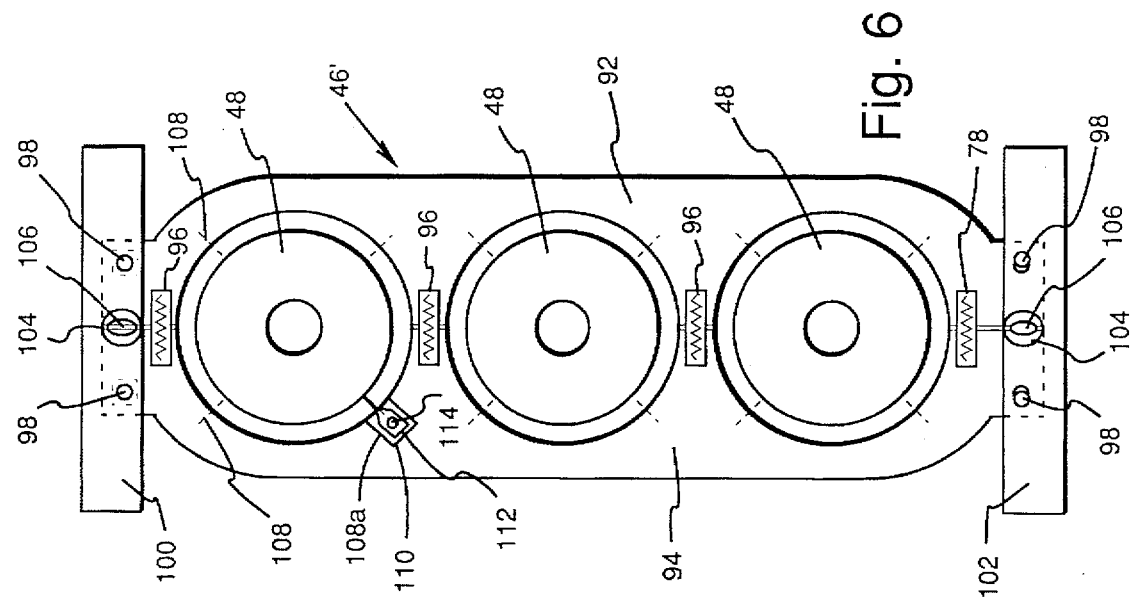
FIG. 6 shows a "traffic light" type of disk-holding device for carrying three disk substrates.

In accordance with another aspect of this invention, FIG. 6 depicts in more detail a substrate-holding device 46 that may be used with the coating machine 10. In this particular embodiment, the holding device 46 is designed for holding three disk or wafer substrates 48. It includes two bi-sectional panels 92 and 94 that are held together along a vertical center line by a set of springs 96. The tension in the springs holds panels 92 and 94 against a set of locating pins 98. These locating pins 98 are in turn attached to mounting blocks 100 and 102 at the top and bottom of the holding device 46, respectively. The mounting blocks 100 and 102 are electrically insulated from their respective support areas in the cylindrical carriage 20. Such electrical insulation allows application of a substrate bias voltage during sputtering. Round holes 104 in the top mounting block 100 and the bottom mounting block 102 overlap, respectively, with elongated or ellipsoidal holes 106 at the top and bottom of the substrate-holding device 46. In this particular embodiment, disk or wafer substrates 48 can be loaded or unloaded from the holding device 46 by inserting rods of a matching elongated or ellipsoidal cross-section into holes 106 and rotating the rods by about 90° to spread apart panels 92 and 94.

Each substrate 48 is supported by spaced holding means 108. For clarity, only one of the holding means 108a is illustrated in detail. Typically, the holding means include a ceramic thermal insulator 110, a "finger" 112, and one or more screws 114. The finger 94 includes a notched or forked end, the size of which matches the thickness of the substrate 48. The screws 114 serve the function of attaching the holding means to the panels 92 and 94 and also as an electrical path between the substrate 48 and the panels 92 and 94. The finger 112 may take the form of a thin twisted ribbon or a bent wire, and may be made of tungsten or other electrically conductive refractory metals or ceramics that are compatible with high-temperature processes. Additionally, the finger 112 provides adequate support and an electrical path to the substrate 48 while maintaining good thermal isolation from the holding device 46. Such electrical conductive path to the conductive substrate allows application of a bias voltage during sputtering.

Figure 7:
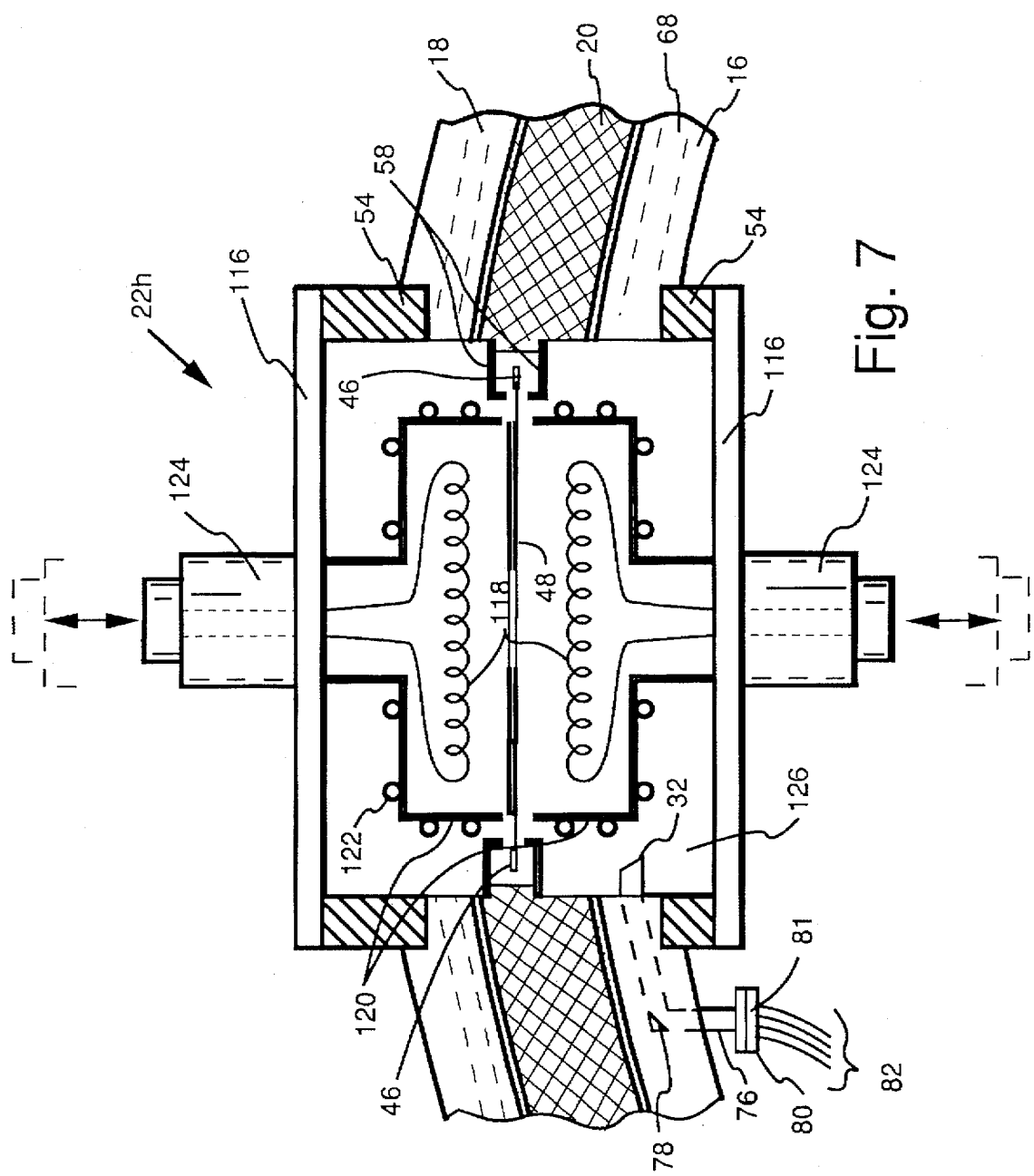
FIG. 7 is a schematic cross-sectional view of a heating station.

In yet another aspect of the present invention, FIG. 7 schematically shows a cross-sectional view of a processing station 22h for heating with its heating elements 118 in the operating position. The heating station 22h accommodates a disk or wafer-holding device 46 containing substrates 48, and shielding means such as shields 58, all of which are similar to the those depicted above in FIG. 4 for a sputtering station. Both the substrate-holding device 46 and the shields 58 are conveniently mounted on the cylindrical carriage 20, and rotate with the cylindrical carriage 20 from station to station during the operation of the machine. Furthermore, the heating station 22h is equipped with an optical monitoring system described above and depicted in FIG. 4. Heating structures 124 are attached to plates 116, which are mounted on vacuum sealing flanges 54. The heating devices may comprise a heating element 118 such as a quartz lamp, surrounded by heat reflective shields 120. The latter may be made of a good heat conducting metal like copper and gold-plated to improve their reflectance. The shields 120 may also include water cooling lines 122, made of copper and attached to shields 120 by soldering or brazing to provide a good path for the conduction of heat to the cooling water. Other suitable materials may also be used for the same purposes.

In the particular case of a three-substrate holder, shields 120 may have the approximate shape of the shields of a traffic signal light. Similar heater designs can be adopted for substrate holders designed for different numbers of substrates.

Figure 8:
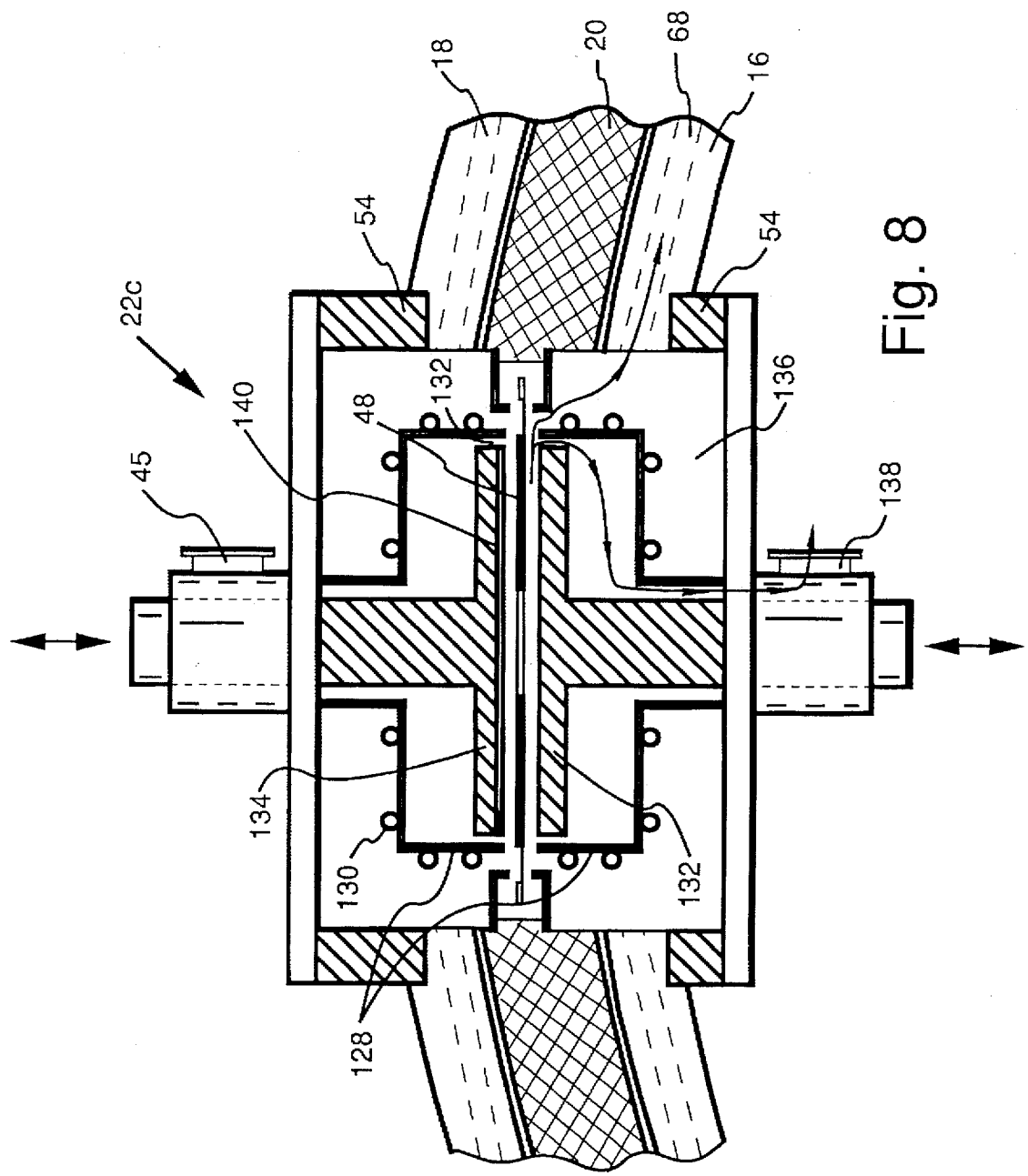
FIG. 8 is a schematic cross-sectional view of a cooling station.

Structures 124 contain electrical and water feed-throughs and support the shields 120 and the heating elements 118. These structures can move back and forth in the direction perpendicular to the cylindrical carriage 20, as indicated by the double-headed arrows. The structures 124 retract out of the way before the cylinder carriage 20 starts to rotate and move into the operating position shown in FIG. 7 right after the cylindrical carriage 20 stops. When the structures 124 are in the operating position, there is very little loss of energy by radiation from the water-cooled shield enclosure 120. This arrangement thus provides very efficient heating of the substrate but not its surroundings. The small amount of scattered radiation into the interior of the chamber 126 is sufficient for operation of the optical monitoring system described above. The latter can be used to determine, e.g., whether a heating lamp is burned out, or whether its output is deteriorating. The intensity ratios of the color filters may be used to detect the latter condition. Very high processing temperatures, e.g., 1,000° C. or above, can be reached with this heater arrangement, thereby making this coating machine compatible with advanced substrate and overcoat materials (e.g., SiC). In accordance with another aspect of the present invention, FIG. 8 schematically shows a cross-sectional view of a processing station 22c for cooling with its cooling elements in the operating position. Cooling stations may be required to avoid exposure of a hot disk coating to air. Exposure to air of the hot disk, or contact with the disk carrier, may cause degradation due to oxidation and/or contamination. Particularly, if high-temperature processing of, e.g., a SiC overcoat, is involved, the high-temperature substrate coated with the SiC overcoat needs to be cooled prior to its exit from the coating machine. In addition, the more conventional DLC overcoat will have improved tribological properties if it is deposited onto a relatively cool substrate. Because the substrate is heated to achieve the desired magnetic properties, some cooling of the substrate are generally needed before the DLC layer is deposited. Since the thermal diffusivity is practically the same as that of aluminum, cooling rates for the two materials by convection or conduction will be approximately the same for substrates of equal thickness. However, since SiC is much stiffer than aluminum, a SiC substrate may be thinner than an aluminum substrate of equal diameter. This property may compensate for the higher processing temperature normally used with SiC substrates.

The cooling station 22c shown in FIG. 8 is structurally similar to the heating station 22h in FIG. 7. From a functional standpoint, the cooling device of this invention is designed to maximize the cooling rate through all three modes of heat transfer, i.e., conduction, convection and radiation.

To maximize cooling by radiation transfer, surfaces that can receive direct or scattered heat radiation from the substrate are preferably made heat-absorbing and are preferably cooled by a circulating chilled fluid (e.g., water or liquid nitrogen). Shields 128 in FIG. 8 are structurally similar to shields 120 in FIG. 7. Functionally, however, shields 128 are heat absorbers rather than heat reflectors. Shields 128 can be made heat-absorbing by coating the base shield material (e.g., copper) with a low-outgassing, high-emissivity black paint similar to the MH-2200 previously mentioned. Radiant heat absorbed by the paint is conducted through the copper base to the chilled fluid cooling lines 130 and removed from the coating system. Cooling of standard aluminum disk substrates, which may not directly contact with a coolant, is conducted through flows of a conductive gas, e.g., helium, at a moderate local pressure (e.g., 20 to 50

Torr), over the surfaces of substrate 48 and across a small gap between the substrate and the helium source (described below). A smaller cavity 132 is created around the substrate by shields 128 and platens 134. This cavity allows the pressure of the helium gas to be locally higher in the gap than in the rest of the interior of chamber 136. As long as leakage of helium into neighboring vacuum chambers is under control, the pressure of the helium gas at the substrate should preferably be made as high as possible to maximize the convective and conductive heat transfer via the gas.

For gas cooling, circular platens 134 function both as heat sinks and as the helium source. These retractable platens 134 have input passage ducts and internal channels for the distribution of the helium gas as well as input and output passages for the cryogenic cooling fluid (e.g., liquid nitrogen). For clarity, these ducts and passages in the platens are not shown in FIG. 8. When a platen 134 is in the operating position, there is a distance of 0.01 in or less between the surface of the platen 134 and the facing substrate face. The helium gas is directed, preferably in an evenly distributed manner, toward the substrate surface, and is pumped away from the substrate surface, through a passageway 68 as well as an auxiliary pumping port 138.

The surfaces of platens 134 that face the surfaces of substrate 48 are also preferably made heat-absorbing by application of a coating like MH-2200. Radiant heat from the substrate that is absorbed by these coatings is removed by the cryogenic cooling. Since radiation heat transfer is determined by the temperature difference between the substrate and the absorbing surfaces and the difference in emissivities of the respective surfaces, those skilled in the art will readily recognize that the specific design of the cooling device should also be optimized with respect to the values of these quantities.

The above cooling device achieves nearly an order of magnitude reduction in the spacing between the platen and substrate surface compared to the cooling device taught in the above-referenced U.S. Pat. No. 5,287,914. Furthermore, the pressure of the conducting gas in the gap between the platen and the substrate is at least doubled. The combination of the above two factors increases the cooling rate by at least an order of magnitude. Cooling rates are additionally improved by the increased radiant heat transferred from the substrate to the high-emissivity, heat-absorbing surfaces of the cryogenically cooled platens 134.

For very hard, high-temperature substrate such as SiC, the preferred method of rapid cooling is by direct thermal contact. In this respect, platens 134 may be placed in direct contact with the coated disks without causing any damage to the disks, as long as the material contacting the disk is clean and softer than the composite hardness of the substrate and its coatings. In this particular embodiment, helium is eliminated, leaving the platens cooled by a closed-loop circulating coolant ranging from hot water to liquid nitrogen depending upon the cooling rate desired and the ability of the substrate to tolerate thermal shock. To ensure intimate thermal contact, the surface of the platens 134 should be approximately as flat as the substrate surfaces, and the cylindrical carrier should preferably be capable of maintaining positional control to within about 0.001 inch. As is known to those skilled in the art, such mechanical specifications are easily met by the use of linear bearings, stepper motors, and positional sensors. The diameter of the faces of the platens should preferably be slightly smaller than the diameter of the substrates to avoid contacting the fingers holding the substrate.

To further ensure intimate thermal contact between the platen surfaces and the substrate surfaces, the surfaces of platens 134 may be covered with a thin compliant layer 140 made of heat-conducting material, e.g., silver-doped silicon rubber. For clarity, only the compliant layer on one of the platens is shown in FIG. 8. The preferable thickness for the thin compliant layer is approximately 0.020 inch to allow the necessary dimensional accommodation of up to 0.001 inch. The exact thickness will depend upon the material of the compliant layer, which should function at both the cooling temperature of the platen and the elevated temperature of the substrate.

If elevated substrate temperatures (e.g., 700° C. and above) are involved, few if any rubber-like materials are currently available that would function well in the above embodiment. In this respect, however, soft metals and their alloys may be used to form the compliant contact layer 140 through the formation of a thin melted region on the surface. The particular soft metal or alloy should be selected to avoid welding to the outmost coating of the substrate. As an example, layer 140 may be made of tin, with a melting point around 232° C. For a substrate whose initial temperature is higher than 232° C., a thin melted layer of tin is formed when made into an intimate contact with the substrate. When the substrate cools below 232° C., the molten tin at the substrate interface solidifies, but still maintains intimate contact for rapid cooling. Simple calculations suggest, as a person skilled in the art readily realizes, that substrate cooling rates of more than one-hundred degrees per second can be achieved this way. Again, the present invention provides a cooling rate that is an order of magnitude higher than can be achieved by using helium only, as taught in the prior art.

An additional gain in cooling rate is obtained by radiative heat transfer from the substrate to the platen as the platen is brought into mechanical contact with the substrate. To make best use of this mode of cooling, the thin compliant layer 140 should be made a good heat absorber by raising its surface emissivity. For example, powdered graphite (or carbon black) may be impregnated in a very thin surface region of a compliant layer made of silver-doped silicon rubber.

Figure 9:
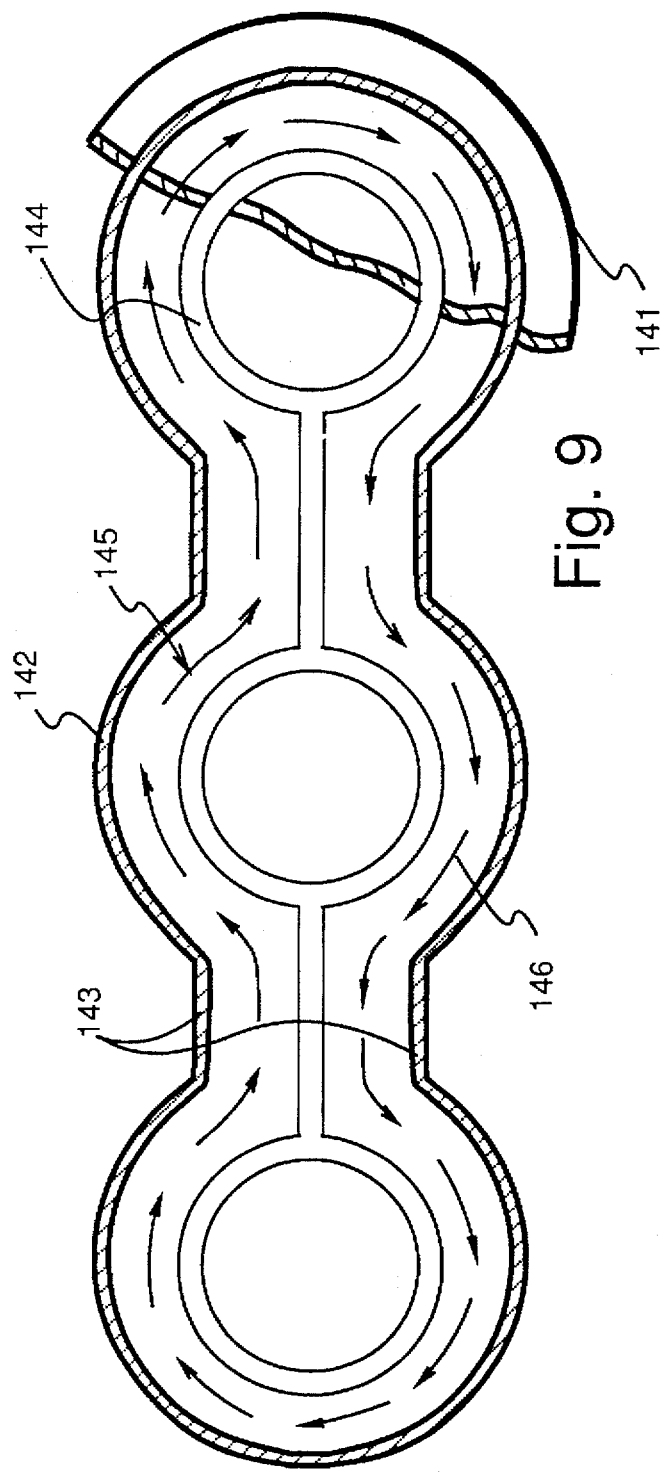
FIG. 9 is a plan view showing a magnetic pole-piece arrangement suitable for simultaneously coating three disk or wafer substrates.

FIG. 9 shows an embodiment of a new design for a generally rectangular planar magnetron that can be utilized in the cylindrical carriage sputtering machine of the present invention, as well as in other sputtering machines. The illustrated embodiment is a design for coating three disk or wafer substrates at a time. Similar designs can be used for different numbers of substrates on the holder. The figure shows only the pole-pieces 142 and 144. Further construction details of the magnetron are similar to a conventional magnetron, as known to those skilled in the art. Outer pole-piece 142 comprises one magnetic polarity, and inner pole-piece 144 comprises the opposite magnetic polarity. The pole-pieces are essentially continuous and are constructed from a highly permeable magnetic material, such as permalloy, iron, or mild steel. In the preferred embodiment, the pole-pieces are accurately shaped from a continuous, relatively thin and flat plate of the permeable material. The pole-pieces are mounted to face the target material on one side, and permanent magnets on the other side. The permanent magnets (not shown) are arranged as two, essentially continuous lines along the contours of pole-pieces 142 and 144, respectively. The permanent magnets in each line have the same magnetic pole (either N or S) aligned along the same direction (toward the pole-piece or the target). However, this direction is opposite for the two lines of permanent magnets. The line of permanent magnets could be used alone without the pole-piece, but the pole-piece serves to better define and smooth the shape of the magnetic field.

Edges of the permanent magnets create local non-uniform regions. A flat plate of permeable magnetic material (shown in part at 141) backs the magnets on the opposite side of the pole-pieces, thereby providing a low reluctance closure path for the magnetic circuit.

The shape of outer magnetic pole-piece 142 is different than the usual oval-like or "racetrack" pattern of a rectangular planar magnetron. It somewhat resembles the shape of three conventional circular planar magnetrons, each of which is used for coating a single disk or wafer substrate. For improved performance, the straight sections 143 of pole-piece 142 may have different magnetic field strength than the curved sections. This can be accomplished by using permanent magnets of different field strength. Inner magnetic pole-piece 144 has opposite magnetic polarity to outer pole-piece 142. Its shape provides a substantially constant separation between the two pole-pieces. The plasma channel, or sputtering groove, 145 in the target is located between the two pole-pieces. Magnetic polarities or facing magnetrons (across both sides of the substrate) should be identical. Thus, outer pole-pieces 142 of both magnetrons can be either north (N) or south (S), as long as they are the same for both magnetrons. Similarly, inner pole-pieces 144 of both magnetrons can be either north (N) or south (S), as long as they are the same for both magnetrons. The direction of electron drift in the plasma channel or tube is shown by arrows 146. If the polarity of the magnetic pole-pieces is inverted, then the direction of the electron drift is reversed.

The illustrated design reduces the cost of the machine. Three conventional individual circular magnetrons would require three individual power supplies. The present magnetron requires only a single power supply for all three disks. It thus saves the cost of two power supplies. The magnetron is particularly suitable for sputter-deposition of non-magnetic materials such as chromium and carbon. Large sputtering targets, consisting of magnetic materials, often have significant local variations of permeability over the target area. Such variations may lead to non-uniform coating thickness. The magnetic material may locally modify the emanating magnetic field from the magnetron, thus creating the non-uniformity. Magnetic material targets may thus require the use of individual circular magnetrons.

The angle of incidence of the coating flux may have significant effect on electrical and magnetic properties. In the conventional rectangular planar magnetron, the angles of incidence of the coating flux onto the substrate are largely determined by the geometry of the oval-like plasma channel, and the position of the substrate relative to the plasma channel. Often the dimension of the plasma channel (i.e., the length of the magnetron) is much larger than the individual disk or wafer substrate. The incidence angles onto the substrates are different for flux arriving from the circular end portions of the magnetron compared to that arriving from the linear portions. Substrates near the end portions of a normal rectangular planar magnetron receive flux from a greater number of directions than substrates near the center.

Figure 10A:
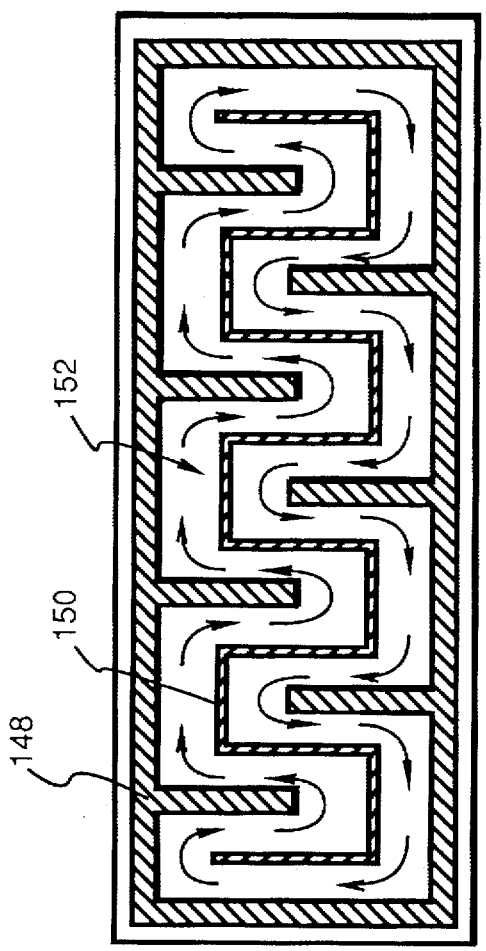
FIG. 10A shows a magnetic pole-piece arrangement for a folded planar magnetron suitable for simultaneously coating two or more disk or wafer substrates.

In this regard, FIG. 10A shows an alternative design for the pole-pieces of a planar magnetron. Both the outer magnetic pole-piece 148 and the inner magnetic pole-piece 150 are "folded" to create a single locally curved plasma channel 152. The construction of this embodiment of the magnetron is similar to the magnetron illustrated in FIG. 9. This design accomplishes several desirable effects. It provides improved uniformity due to a better mixing of the angles of incidence of the coating flux along the entire length of the magnetron. The many locally curved shapes of the plasma channel tend to average the angles of incidence. Also, the much longer sputtering groove of this magnetron substantially improves target utilization over the conventional oval-shaped groove design. The magnetic strength of the pole-pieces 148 and 150 may be varied locally by using magnets of different magnetic field strengths in order to improve the deposition uniformity.

Figure 10B:
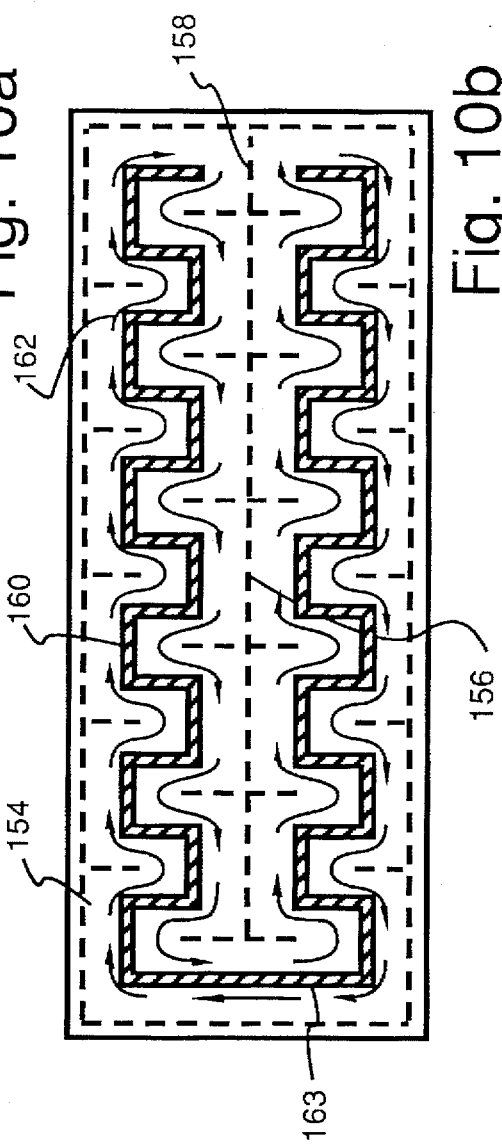
FIG. 10B shows a magnetic pole-piece arrangement for a double-folded planar magnetron suitable for simultaneously coating two or more disk or wafer substrates.

FIG. 10B shows another alternative embodiment of a "double-folded" magnetron design. To achieve the double fold, the outer pole-piece 154 includes along a central piece 156. The outer pole-piece 154 and the central piece 156 join at a point 158. The inner pole-piece 160 does not close on itself. The plasma channel 162 of this design is similar to two plasma channels 152 of the type shown in FIG. 10A, with the inner pole-pieces joined at one end, i.e., at 163 at the left side in FIG. 10B, and the outer pole-pieces joined at 158 on the right side. This magnetron design functions like the magnetron of FIG. 10A with a single plasma channel. For practical reasons, the physical width of the magnetron must be sufficient to allow approximately one inch wide plasma channels.

Figure 11C:
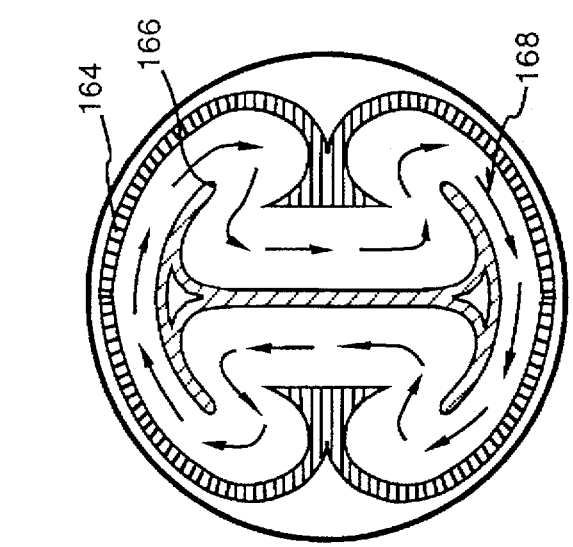
FIGS. 11A–11C show three magnetic pole-piece arrangements of circular planar magnetrons each suitable for coating a single disk or wafer substrate.
Figure 11B:
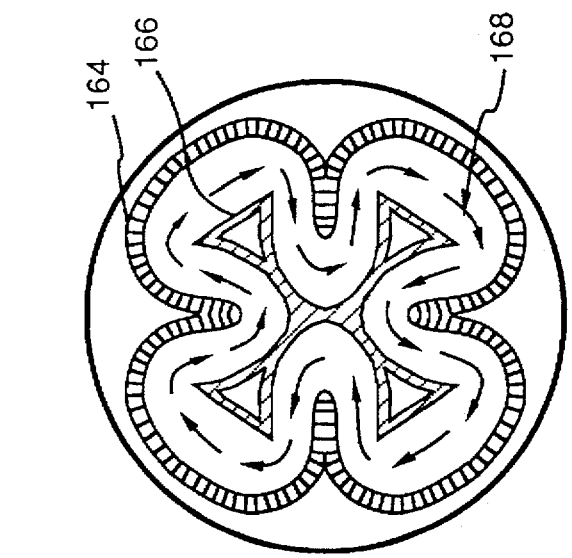
Figure 11A:
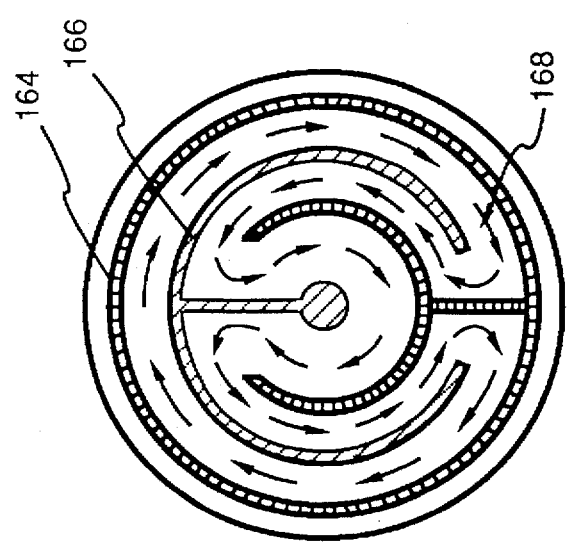

In other embodiments, circular planar magnetrons can also include various foldings of magnetic piece-poles in order to create locally curved plasma channels. Such magnetrons are generally suitable for single-substrate coating. FIGS. 11A, 11B and 11C depict three particular embodiments of such folded design. In any of the designs depicted in FIGS. 11A, 11B and 11C, the outer pole-pieces 164 and inner pole-pieces 166 together define the plasma channels 168. Any of these patterns may be rotated in a planetary manner with respect to the target for improved target utilization, uniformity, and longer target life. Additionally, the strength of pole-pieces 164 and 166 may be varied locally to improve deposition uniformity. Magnetrons of these designs can be used to minimize the deleterious effects of permeability variations associated with sputtering targets of magnetic materials.

Each of the magnetron designs depicted in FIGS. 9, 10A, 11A, 11B and 11C be used in the cylindrical coating machine of the present invention, as well as in sputtering or coating machines involving magnetrons.

Although the present invention has been described above in terms of a specific embodiment, it is anticipated that other uses, alterations and modifications thereof will no doubt become apparent to those skilled in the art. For example, a similarly configured system might be used to coat flat panel display screens, solar cells, laser mirrors, glass plates, lamp housings and envelopes, optical memory disks, etc. It is therefore intended that the following claims be interpreted as covering all such alterations and modifications as fall within the true spirit and scope of the invention.

What is claimed is:

1. A cylindrical vacuum deposition apparatus for depositing at least one layer of coating material on substrates, comprising:

means forming a sealed annular chamber and including first and second concentric cylinder walls joined together by top and bottom annular sealing flanges, at least one of said cylinder walls including at least one opening a cylindrical carriage formed by a third rotatable cylinder disposed within said annular chamber between said two cylinder walls;

at least one opening being formed in said carriage and including means for supporting at least one said substrate;

mechanical rotation means providing controlled positioning of said carriage relative to said first and second cylinder walls and within a passageway defined by said annular chamber;

at least one processing station in communication with said at least one opening and including equipment selected from the group consisting of layer deposition means, substrate heating means, substrate cooling means, substrate etching means, and substrate dwell means;

vacuum pumping means for evacuating atmospheric gases said chamber;

vacuum load-lock means formed in at least one of said first and second cylinder walls facilitating the loading and unloading of substrates to and from said carriage; and electrical power supply means for operating said processing stations.

2. A cylindrical vacuum deposition apparatus as recited in claim 1 wherein at least one of said first and second cylinder walls includes a series of openings formed therein and equally spaced around the circumference thereof for accommodating said processing stations, said pumping means and said load-lock means.

3. A cylindrical vacuum deposition apparatus as recited in claim 2 wherein said carriage includes a series of said openings equally spaced around the circumference thereof.

4. A cylindrical vacuum deposition apparatus as recited in claim 1 wherein said carriage substantially fills said passageway.

5. A cylindrical vacuum deposition apparatus as recited in claim 1 wherein said opening in said cylindrical carriage includes support means for a multiplicity of substrates.

6. A cylindrical vacuum deposition apparatus as recited in claim 5 wherein said support means is adapted to carry three vertically positioned substrates disposed one above another.

7. A cylindrical vacuum deposition apparatus as recited in claim 1 wherein said rotation means includes a circular rack gear associated with said cylindrical carriage and a mating pinion driven by a motor.

8. A cylindrical vacuum deposition apparatus as recited in claim 1 wherein said processing station includes layer deposition means having a circular planar magnetron.

9. A cylindrical vacuum deposition apparatus as recited in claim 1 wherein said processing station includes layer deposition means having a rectangular planar magnetron.

10. A cylindrical vacuum deposition apparatus as recited in claim 1 wherein processing station includes layer deposition means having chemical vapor deposition means.

11. A cylindrical vacuum deposition apparatus as recited in claim 1 wherein said processing station includes substrate heating means having a "signal-light" configured heating device.

12. A cylindrical vacuum deposition apparatus as recited in claim 1 wherein said processing station includes substrate etching means having ion gun etching means.

13. A cylindrical vacuum deposition apparatus as recited in claim 1 wherein said processing station includes substrate etching means having reactive ion etching means.

14. A cylindrical vacuum deposition apparatus as recited in claim 1 wherein said processing station includes substrate cooling means having a "signal-light" configured cooling device.

15. A cylindrical vacuum deposition apparatus as recited in claim 1 wherein at least one of said processing stations is further equipped with an optical monitoring device.

16. A cylindrical vacuum deposition apparatus as recited in claim 1 wherein said vacuum pumping means comprises at least one turbomolecular pump.

17. A cylindrical vacuum deposition apparatus as recited in claim 1 wherein said vacuum pumping means includes mechanical roughing pumps, roots blower pumps, and cryogenic pumps attached to said vacuum load-lock means.

18. A coating system for coating one or more substrates, comprising:

an inner cylinder;

an outer cylinder disposed concentric with said inner cylinder and cooperating therewith to define an annular chamber; and a central cylinder fitted between, and rotatable within said chamber relative to, said inner and said outer cylinders, said central cylinder having receptacle means provided therein for receiving one or more substrates to be coated;

at least one of said inner and said outer cylinders including
an input station through which said one or more substrates may be loaded into said receptacle means;
an output station through which said substrates may be unloaded from said receptacle means and out of said coating system; and
one or more coating stations for coating said substrates.

19. A coating system for coating one or more substrates, comprising:

an inner cylinder;

an outer cylinder disposed concentric with said inner cylinder;

a top annular member connecting the tops of said inner and said outer cylinders;

a bottom annular member connecting the bottoms of said inner and said outer cylinders, said inner cylinder, said outer cylinder, said top annular member, and said bottom annular member and defining a sealed chamber;

a central cylinder disposed within said chamber and fitted between, and rotatable relative to, said inner and said outer cylinders, said central cylinder including one or more receptacles for holding substrates;

said inner and outer cylinders including
an input station through which said one or more substrates may be loaded into said coating system;
an output station through which said one or more substrates may be unloaded out of said coating system;
one or more coating stations for coating said substrates; and
one or more pumping stations for evacuating said chamber.

20. A coating system as recited in claim 19, wherein:

said top and said bottom annular members are sealing flanges;

said central cylinder substantially fills said chamber; and said inner and said outer cylinders include one or more heating stations for heating substrates carried by said central cylinder and one or more cooling stations for cooling substrates carried by said central cylinder.

21. A coating system as recited in claim 20, wherein:

said input station includes a vacuum load-lock; and said output station includes a vacuum exit-lock.

22. A coating system as recited in claim 21, wherein said one or more coating stations include a planar magnetron and a sputtering target.

* * * * *